US008766690B2

(12) United States Patent
Yen

(10) Patent No.: US 8,766,690 B2
(45) Date of Patent: Jul. 1, 2014

(54) DEVICE WITH AUTOMATIC DE-SKEW CAPABILITY

(75) Inventor: Yu Jen Yen, Tainan (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 15 days.

(21) Appl. No.: 13/567,423

(22) Filed: Aug. 6, 2012

(65) Prior Publication Data

US 2013/0038367 A1 Feb. 14, 2013

(30) Foreign Application Priority Data

Aug. 9, 2011 (TW) ............................ 100128298 A

(51) Int. Cl.
*H03K 5/12* (2006.01)
*H03L 7/00* (2006.01)

(52) U.S. Cl.
USPC ............................ 327/170; 327/141; 327/144

(58) Field of Classification Search
None
See application file for complete search history.

(56) References Cited

U.S. PATENT DOCUMENTS 6,114,890 A * 9/2000 Okajima et al. .............. 327/170
7,590,879 B1 * 9/2009 Kim et al. ...................... 713/401
2010/0164583 A1 * 7/2010 Chen et al. .................... 327/261
2012/0112812 A1 * 5/2012 Chen et al. .................... 327/176
2013/0038582 A1 * 2/2013 Yen .............................. 345/204

* cited by examiner

*Primary Examiner* — Tuan T Lam

(57) ABSTRACT

A source driver with an automatic de-skew capability is configured to receive a data signal and a clock signal from a timing controller, which are configured to drive a liquid crystal display panel. The source driver includes a signal delay unit, a setup time register, a hold time register, a first signal delay unit, a second delay unit and a logic circuit. In one embodiment of the present disclosure, the first data delay signal is configured to sample the second clock delay signal and the second data delay signal is configured to sample the first clock delay signal.

11 Claims, 7 Drawing Sheets

DEVICE WITH AUTOMATIC DE-SKEW CAPABILITY

BACKGROUND

1. Technical Field

The present disclosure relates to an electronic device with an automatic de-skew capability, and in particular, to a source driving device with an automatic de-skew capability.

2. Description of the Related Art

Due to rapid developments in technology, the LCD is now applied in a wide range of electronic devices such as mobile phones, PCs, laptops, and flat-screen TVs. A timing controller of a LCD is usually utilized for generating data signals, related to imaging displays, control signals and clock signals for driving the LCD panel. The source driving device of the LCD executes logic calculations based on data signals, clock signals and control signals to generate driving signals for the LCD panel.

The transmission interfaces, including TTL (Transistor-Transistor Logic), LVDS (Low-Voltage Differential Signaling), RSDS (Reduced Swing Differential Signaling) and mini-LVDS (Mini Low-Voltage Differential Signaling), are widely applied on the current LCD. However, it is necessary for data signals, control signals and clock signals to work together in harmony whether transmitting signals via any type of interfaces, so that the internal logic circuit of the source driving device may correctly read data for generating correct driving signals.

Resulting from the development of large scale LCDs, users have a high demand for resolution quality and as such, the size of the LCD panel, quantity of the source driving devices and size of the data transmitting interfaces are also increased, such as PCBs. Therefore, signal transmitting paths between the timing controller and the source driving device of large scale LCDs become longer, so that the signal transmitting time also becomes longer. Moreover, since the circuit layouts between the timing controller and different source driving devices are different from each other, the distance of the signal transmitting paths between the timing controller and different source driving devices are also different.

Due to every driving device having a different toggle rate, ground shielding and driving capability during the output stage, different source driving devices may receive signals with different delays. Consequently, the phase difference of the signals may deviate from a predetermined deviation so that the internal circuit of the source driving device cannot correctly read data. The signal skew may greatly affect the display quality of the LCD, especially in high frequency applications.

In conventional LCDs, the phase relationship between data signals and clock signals, generated by the timing controller, are fixed. The set-up time and hold time are also fixed. Due to different source driving devices include differences in the distance of signal transmitting paths, toggle rates, ground shielding and driving capability during the output stage, the data signals and clock signals, with different delays, are received by the source driving device. As a result, the conventional LCD may lack the ability to automatically de-skew, such that the LCD may have an inferior display quality.

Therefore, the present disclosure provides a device with an automatic de-skew capability.

SUMMARY

In accordance with one embodiment of the present disclosure, a source driver with an automatic de-skew capability, coupled between a source driving device and a time schedule controller, is configured for receiving a data signal and a clock signal from the time controller for driving a display panel, comprising a data signal delay module, a setup time register, a hold time register, a first signal delay unit, a second signal delay unit, a logic circuit and a data register.

In one embodiment of the present disclosure, the data signal delay module further comprises a data signal variable delay circuit and a clock signal variable delay circuit. In one embodiment of the present disclosure, the data signal variable delay circuit may be configured for receiving the data signal and is configured to generate a first data delay signal, and the clock signal variable delay circuit may be configured for receiving the clock signal and is configured to generate a first clock delay signal.

In one embodiment of the present disclosure, the first signal delay unit, coupled between the output terminal of the data signal variable delay circuit and a clock signal input terminal of the setup time register, is configured to generate a second data delay signal. In one embodiment of the present disclosure, the second signal delay unit, coupled between the output terminal of the clock signal variable delay circuit and a data signal input terminal of the hold time register, is configured to generate a second clock delay signal.

In one embodiment of the present disclosure, the logic circuit, coupled between the setup time register and the hold time register, is configured to generate a control signal to the signal delay device. Furthermore, the data register includes a clock input terminal coupled to the clock signal variable delay circuit and a data input terminal coupled to the data signal variable delay circuit.

In one embodiment of the present disclosure, the first data delay signal is configured to sample the second clock delay signal and the second data delay signal is configured to sample the first clock delay signal.

In order to provide further understanding of the techniques, means, and effects of the present disclosure, the following detailed description and drawings are hereby presented, such that the purposes, features and aspects of the present disclosure may be thoroughly and concretely appreciated. However, the drawings are provided solely for reference and illustration, without any intention to be configured for limiting the present disclosure.

BRIEF DESCRIPTION OF THE DRAWINGS

The objectives and advantages of the present disclosure are illustrated with the following description and upon reference to the accompanying drawings in which.

DETAILED DESCRIPTION

In order to correct any lack of ability to automatically de-skew which the conventional LCD may experience, the present disclosure discloses a source driving device with an automatic de-skew capability.

Figure 1:
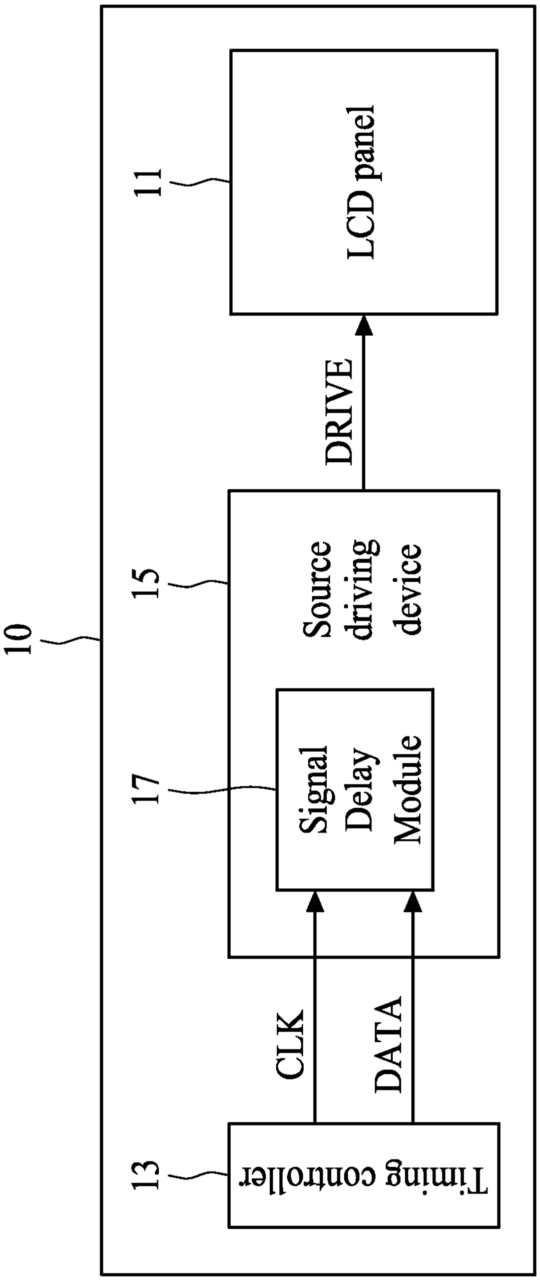
FIG. 1 shows function blocks of a LCD display.

FIG. 1 shows function blocks of a LCD display 10. As shown, the timing controller 13 may generate a clock signal CLK and a data signal DATA, and the clock signal CLK and the data signal DATA may be transmitted to a source driving device 15. Furthermore, after performing an auto-skew by a signal delay module 17 of the source driving device, an adjusted clock signal CLK and an adjusted data signal DATA are utilized to drive a LCD panel 11.

Figure 2:
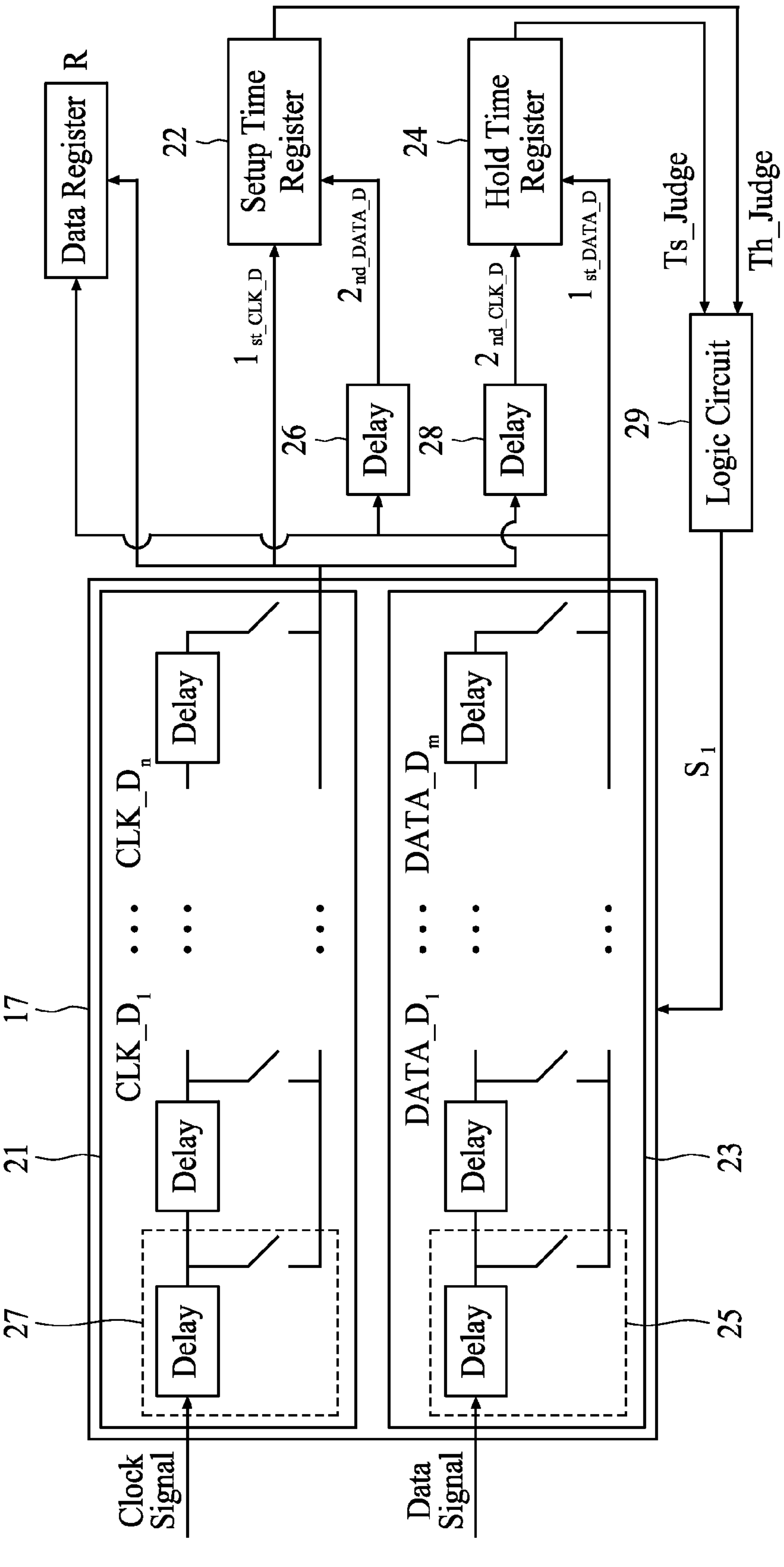
FIG. 2 shows a schematic view of one embodiment of the present disclosure indicating a source driving device.

FIG. 2 shows a schematic view of one embodiment of the present disclosure indicating a source driving device 15. The source driving device 15 includes a data delay module 17, a setup time register 22, a hold time register 24, a first signal delay unit 26, a second signal delay unit 28 and a logic circuit 29. The signal delay module 17 includes a clock signal variable delay circuit 21 and a data signal variable delay circuit 23. The clock signal variable delay circuit 21 further includes a plurality of clock signal delay switches 27 which are labeled as $CLK\_D_1$ to $CLK\_D_n$. The data signal variable delay circuit 23 also includes a plurality of data signal delay switches 25 which is labeled as $DATA\_D_1$ to $DATA\_D_m$.

The data signal variable delay circuit 23, having an signal output terminal respectively coupled to the first signal delay unit 26 and a data signal input terminal of a data register R, may be configured to receive the data signal DATA. The clock signal variable delay circuit 21, having an signal output terminal respectively coupled to the second signal delay unit 28 and a clock signal input terminal of the data register R, may be configured to receive the clock signal CLK.

The first signal delay unit 26 is coupled between the signal output terminal of the data signal variable delay circuit 23 and a clock signal input terminal of the setup time register 22. The second signal delay unit 28 is coupled between the signal output terminal of the clock signal variable delay circuit 21 and a data signal input terminal of the hold time register 24. The logic circuit 29, coupled between the setup time register 22 and the hold time register 24, may be configured to generate a control signal $S_1$ to the signal delay module 17.

The clock signal variable delay circuit 21 is configured to generate a first clock delay signal $1^{st}$_CLK_D to the clock input terminal of the data register R, the data signal input terminal of the setup time register 22 and the second signal delay unit 28. The second signal delay unit 28 may delay the first clock delay signal $1^{st}$_CLK_D to further generate a second clock delay signal $2^{nd}$_CLK_D to the clock signal input terminal of the hold time register 24.

The data signal variable delay circuit 23 is configured to generate a first data delay signal $1^{st}$_DATA_D to the data signal input terminal of the data register R, the clock signal input terminal of the hold time register 24 and the first signal delay unit 26. The first signal delay unit 26 may delay the first data delay signal $1^{st}$_DATA_D to further generate a second data delay signal $2^{nd}$_DATA_D to the clock signal input terminal of the setup time register 22.

As a rising edge of the data delay signal indicates to a center of hold time of the clock signal, taking place in the setup time register 22 and in the hold time register 24, a correct sample may be determined.

In the setup time register 22, the phase of the first clock delay signal $1^{st}$_CLK_D is compared with the phase of the second data delay signal $2^{nd}$_DATA_D to generate a first comparison result to confirm whether the second data delay signal $2^{nd}$_DATA_D is capable of correctly sampling the first clock delay signal $1^{st}$_CLK_D. Furthermore, the setup time register 22 generates a first logic level Ts_Judge, according to the first comparison result, to the logic circuit 29.

In the hold time register 24, the phase of the first data delay signal $1^{st}$_DATA_D is compared with the phase of the second clock delay signal $2^{nd}$_CLK_D to generate a second comparison result to confirm whether the first data delay signal $1^{st}$_DATA_D is capable of correctly sampling the first clock delay signal $2^{nd}$_CLK_D. Furthermore, the hold time register 24 generates a second logic level Th_Judge, according to the second comparison result, to the logic circuit 29.

The logic circuit 29 may generate a control signal S1, according to the first logic level Ts_Judge and the second logic level Th_Judge, to the signal delay module 17 to further control conducting numbers of the plurality of data delay signal switches 25 and the plurality of clock signal delay switches 27.

Therefore, the data signal variable delay circuit 23 may be capable of generating a correct first clock delay signal $1^{st}$_CLK_D and the clock signal variable delay circuit 21 may be capable of generating a correct first data delay signal $1^{st}$_DATA_D, such that, the data register R may be capable of outputting a correct logic level to drive the LCD panel 11. Meanwhile, other data registers, not shown, may also be capable of outputting correct logic levels, according to the correct first clock delay signal $1^{st}$_CLK_D and the correct first data delay signal $1^{st}$_DATA_D, to drive the LCD panel 11.

Figure 3:
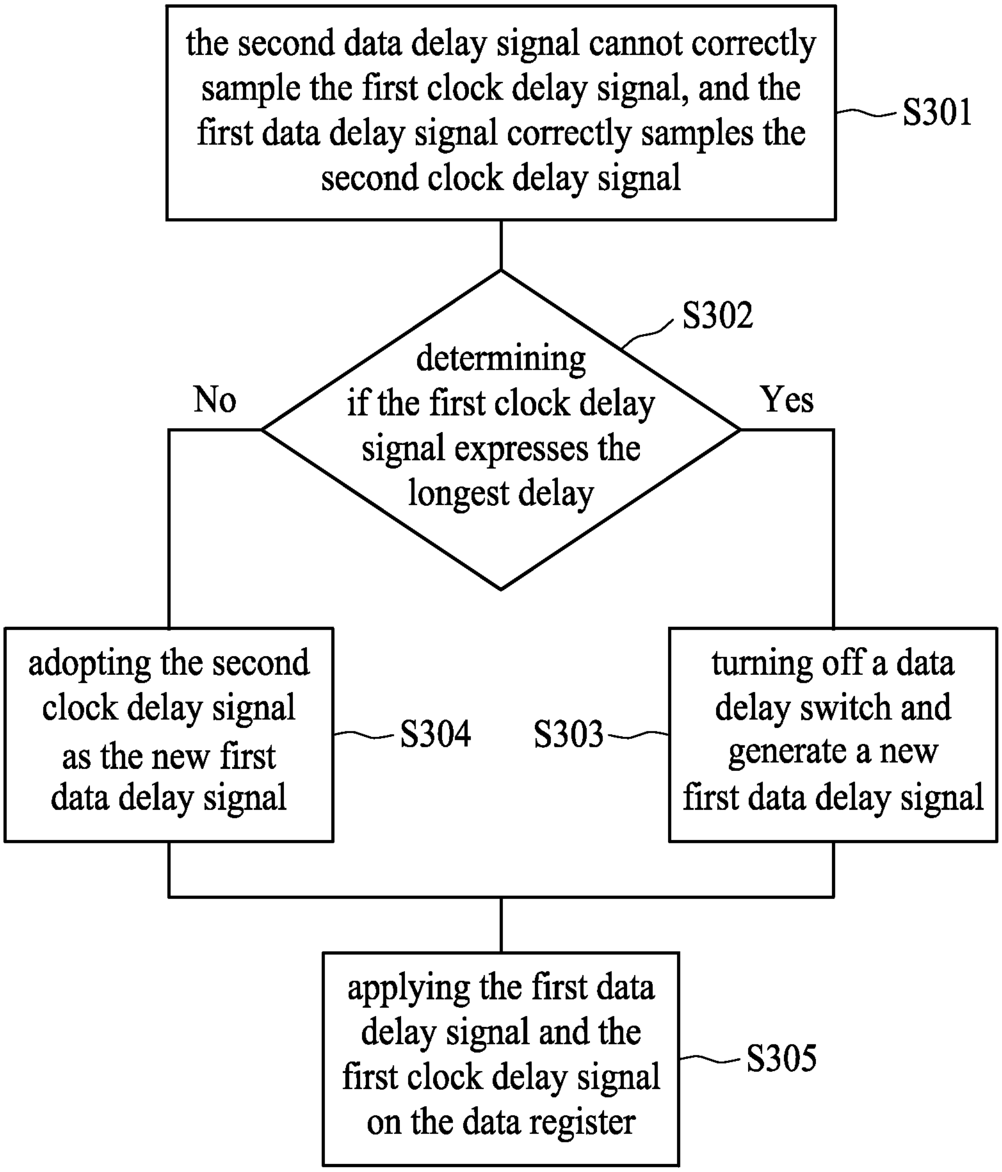
FIG. 3 shows a signal comparison flow chart of one embodiment of the present disclosure.

FIG. 3 shows a signal comparison flow chart of one embodiment of the present disclosure. As shown in FIG. 3, step S301, while the second data delay signal $2^{nd}$_DATA_D cannot correctly sample the first clock delay signal $1^{st}$_CLK_D, and the first data delay signal $1^{st}$_DATA_D correctly samples the second clock delay signal $2^{nd}$_CLK_D, step S302 may be performed to determine if the first clock delay signal $1^{st}$_CLK_D expresses the longest delay. Step S303 would be performed to turn off a data delay switch 25 and generate a new first data delay signal $1^{st}$_DATA_D. If the first clock delay signal $1^{st}$_CLK_D is not the longest delay, step S304 would be performed and the second clock delay signal $2^{nd}$_CLK_D would be the new first data delay signal $1^{st}$_DATA_D. In step S305, the first data delay signal $1^{st}$_DATA_D and the first clock delay signal $1^{st}$_CLK_D are applied on the data register.

Figure 7:
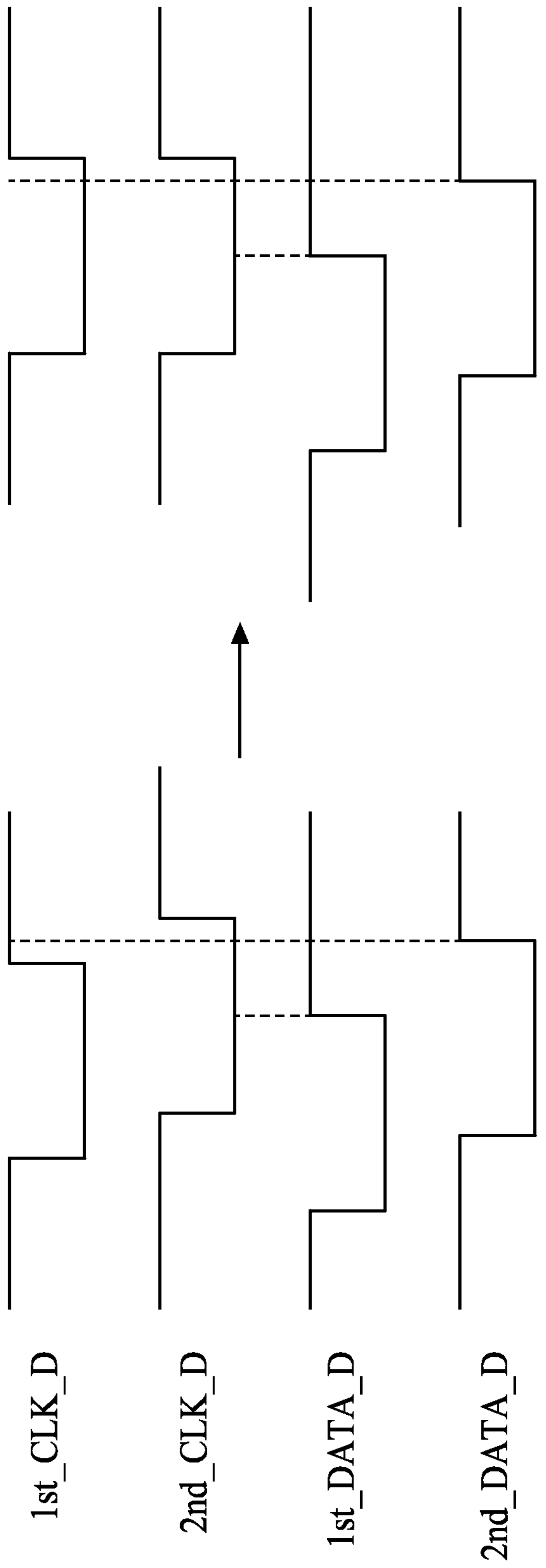
FIG. 7 shows a signal comparison flow chart of one embodiment of the present disclosure.

FIG. 7 shows a signal comparison flow chart of one embodiment of the present disclosure. As shown in FIG. 7, while a rising edge of the second data delay signal $2^{nd}$_DATA_D cannot correctly sample the first clock delay signal $2^{nd}$_CLK_D, the first data delay signal $1^{st}$_DATA_D correctly samples the second clock delay signal $2^{nd}$_CLK_D. Furthermore, the first clock delay signal $1^{st}$_CLK_D is not the longest delay, and the second clock delay signal $2^{nd}$_CLK_D would be a new first clock delay signal $1^{st}$_CLK_D. Therefore, the second clock delay signal $2^{nd}$_DATA_D would be capable of correctly sampling the new first clock delay signal $1^{st}$_CLK_D.

Figure 4:
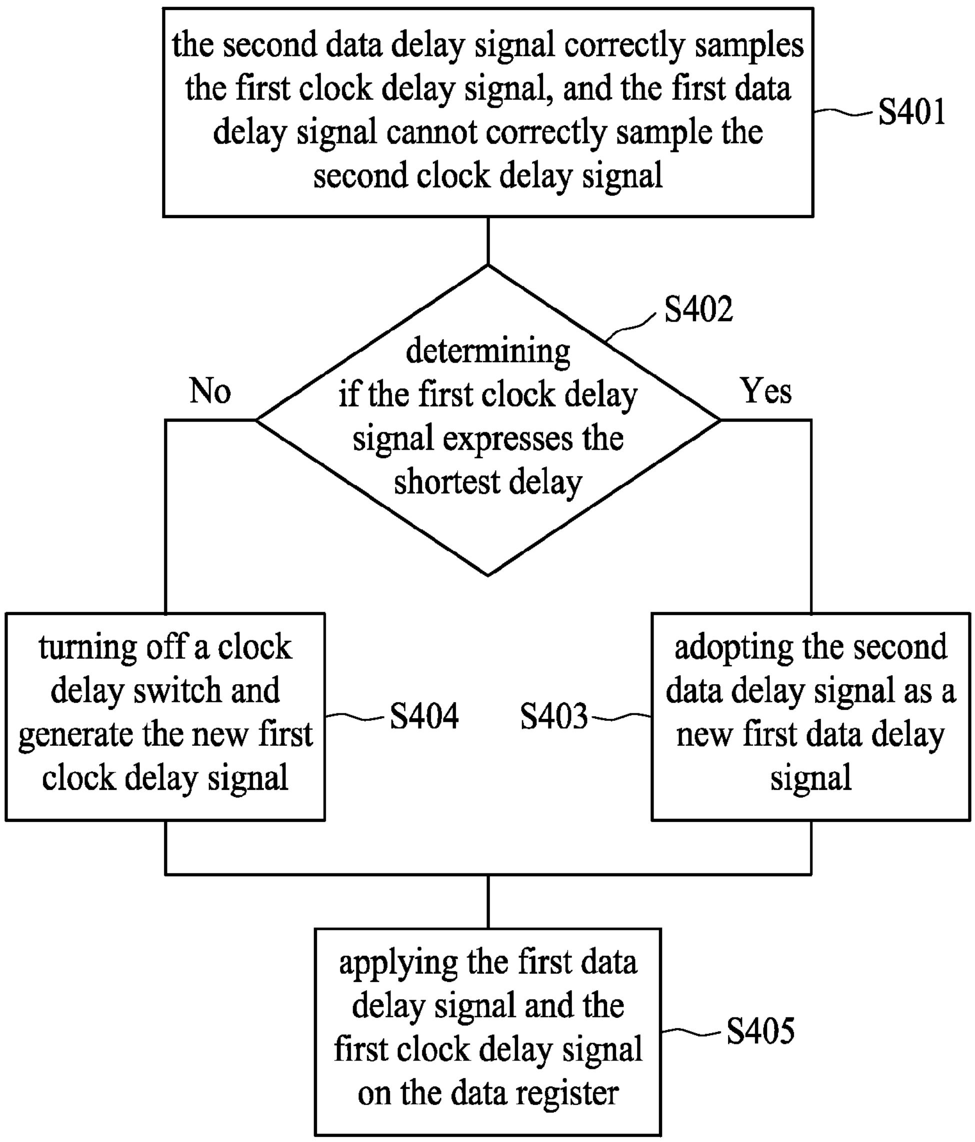
FIG. 4 shows a signal comparison flow chart of one embodiment of the present disclosure.

FIG. 4 shows a signal comparison flow chart of one embodiment of the present disclosure. As shown in FIG. 4, step S401, while the second data delay signal $2^{nd}$_DATA_D correctly samples the first clock delay signal, and the first data delay signal $1^{st}$_DATA_D cannot correctly sample the second clock delay signal $2^{nd}$_CLK_D, step S402 may be performed to determine if the first clock delay signal $1^{st}$_CLK_D expresses the shortest delay. If the first clock delay signal $1^{st}$_CLK_D is the shortest delay, step S403 would be performed, and the second data delay signal $2^{nd}$_DATA_D would be a new first data delay signal $1^{st}$_DATA_D. If the first clock delay signal $1^{st}$_CLK_D is not the shortest delay, step S404 would be performed to turn off a clock delay switch and generate the new first clock delay signal $1^{st}$_CLK_D. In step S405, the first data delay signal 1st_DATA_D and the first clock delay signal 1st_CLK_D are applied on the data register R.

Figure 5:
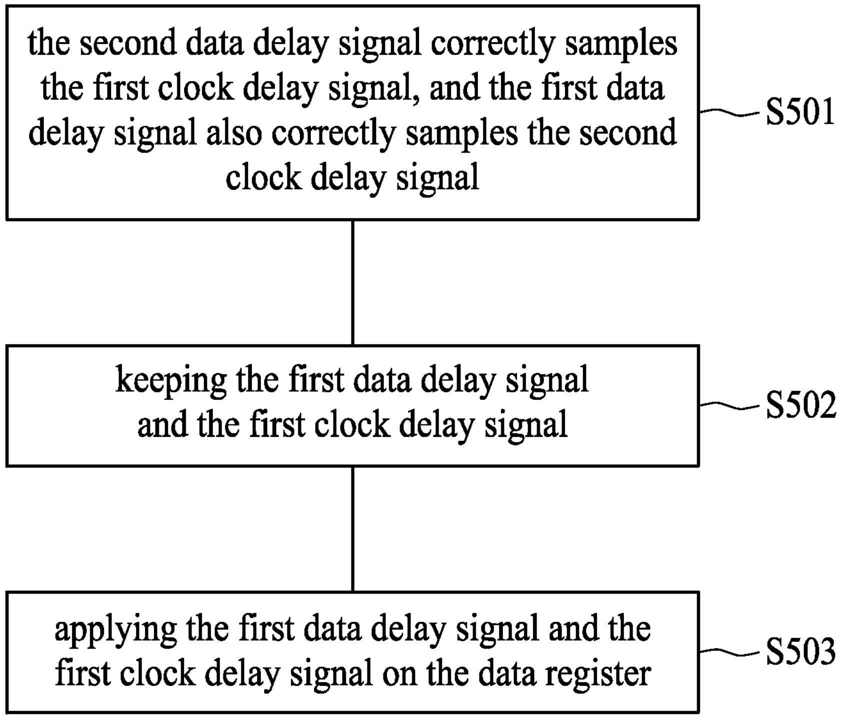
FIG. 5 shows a signal comparison flow chart of one embodiment of the present disclosure.

FIG. 5 shows a signal comparison flow chart of one embodiment of the present disclosure. As shown in FIG. 5, step S501, while the second data delay signal 2nd_DATA_D correctly samples the first clock delay signal 1st_CLK_D, and the first data delay signal 1st_DATA_D also correctly samples the second clock delay signal 2nd_CLK_D, step S502 may be performed to keep the first data delay signal 1st_DATA_D and the first clock delay signal 1st_CLK_D. In step S503, the first data delay signal 1st_DATA_D and the first clock delay signal 1st_CLK_D are applied on the data register R. Furthermore, the setup time and hold time of the register would work together in harmony.

Figure 6:
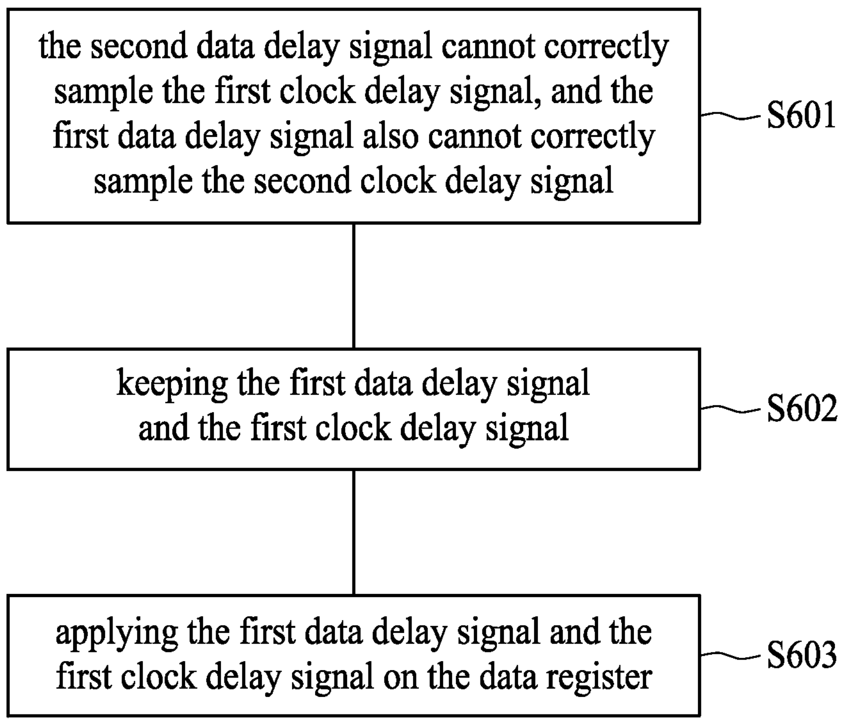
FIG. 6 shows a signal comparison flow chart of one embodiment of the present disclosure.

FIG. 6 shows a signal comparison flow chart of one embodiment of the present disclosure. As shown in FIG. 6, step S601, while the second data delay signal 2nd_DATA_D cannot correctly sample the first clock delay signal 1st_CLK_D, and the first data delay signal 1st_DATA_D also cannot correctly sample the second clock delay signal 2nd_CLK_D, step S602 may be performed to keep the first data delay signal 1st_DATA_D and the first clock delay signal 1st_CLK_D. In step S603, the first data delay signal 1st_DATA_D and the first clock delay signal 1st_CLK_D are applied on the data register R. Furthermore, the setup time and hold time of the register would work together in harmony.

Although the present disclosure and its objectives have been described in detail, it should be understood that various changes, substitutions and alterations can be made herein without departing from the spirit and scope of the invention as defined by the appended claims. For example, many of the processes discussed above can be implemented using different methodologies, replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A source driver with an automatic de-skew capability, coupled between a source driving device and a time schedule controller, is configured for receiving a data signal and a clock signal from the time controller for driving a display panel, comprising:
- a data signal delay module, comprising:
  - a data signal variable delay circuit, which is configured for receiving the data signal and is configured to generate a first data delay signal; and
  - a clock signal variable delay circuit, which is configured for receiving the clock signal and is configured to generate a first clock delay signal;
- a setup time register, having a data signal input terminal coupled to an output terminal of the clock signal variable delay circuit;
- a hold time register, having a clock signal input terminal coupled to an output terminal of the data signal variable delay circuit;
- a first signal delay unit, coupled between the output terminal of the data signal variable delay circuit and a clock signal input terminal of the setup time register, is configured to generate a second data delay signal;
- a second signal delay unit, coupled between the output terminal of the clock signal variable delay circuit and a data signal input terminal of the hold time register, is configured to generate a second clock delay signal;
- a logic circuit, coupled between the setup time register and the hold time register, is configured to generate a control signal to the signal delay module; and
- a data register, having a clock input terminal coupled to the clock signal variable delay circuit and a data input terminal coupled to the data signal variable delay circuit;
- wherein the first data delay signal is configured to sample the second clock delay signal and the second data delay signal is configured to sample the first clock delay signal.

2. The source driver of claim 1, wherein the data signal variable delay circuit includes a plurality of data signal delay switches.

3. The source driver of claim 1, wherein the clock signal variable delay circuit includes a plurality of clock signal delay switches.

4. The source driver of claim 1, wherein a correct sampling is defined as a raised edge of a data delay signal point to center of data holding time interval of the clock signal.

5. The source driver of claim 1, wherein a new clock delay signal or a new data delay signal is generated based on whether the first clock delay signal is the shortest delay signal, while the second data delay signal correctly samples the first clock delay signal, and the first data delay signal cannot correctly sample the second clock delay signal.

6. The source driver of claim 5, wherein the second data delay signal is configured as the new first data delay signal when the first clock delay signal is the shortest delay signal.

7. The source driver of claim 5, wherein the new clock delay signal is a regenerated clock delay signal when the first clock delay signal is not the shortest delay signal.

8. The source driver of claim 1, wherein a new clock delay signal or a new data delay signal is generated, based on whether the first clock delay signal is the longest delay signal, when the second data delay signal cannot correctly sample the first clock delay signal and the first data delay signal correctly samples the second clock delay signal.

9. The source driver of claim 8, wherein the new clock delay signal is a regenerated clock delay signal when the first clock delay signal is the longest delay signal.

10. The source driver of claim 8, wherein the second clock delay signal become the new clock delay signal when the first clock delay signal is not the longest delay signal.

11. The source driver of claim 1, wherein the first clock delay signal and the first data delay signal would be kept and adopted, while the second data delay signal correctly samples the first clock delay signal and the first data delay signal correctly samples the second clock delay signal, or while the second data delay signal cannot correctly sample the first clock delay signal and the first data delay signal cannot correctly sample the second clock delay signal.

* * * * *